United States Patent [19]
Nagamatsu et al.

[11] Patent Number: 5,764,086
[45] Date of Patent: Jun. 9, 1998

[54] COMPARATOR CIRCUIT WITH WIDE DYNAMIC RANGE

[75] Inventors: Tetsu Nagamatsu, Kawasaki; Tadahiro Kuroda, Yokohama, both of Japan

[73] Assignee: Kabushiki Kaisha Toshiba, Tokyo, Japan

[21] Appl. No.: 707,661

[22] Filed: Sep. 4, 1996

[30] Foreign Application Priority Data

Sep. 4, 1995 [JP] Japan .................. 7-226571

[51] Int. Cl.⁶ .................................................. H03K 5/26
[52] U.S. Cl. .................. 327/65; 327/52; 327/53; 327/55; 327/66
[58] Field of Search ................ 327/52, 53, 54, 327/55, 58, 62, 65, 66, 67, 70, 72, 74, 77, 78, 79, 85, 87, 89, 270, 269

[56] References Cited

U.S. PATENT DOCUMENTS

| | | | |
|---|---|---|---|
| 3,665,215 | 5/1972 | Boronkay | 307/230 |
| 3,955,102 | 5/1976 | Chi | 307/235 E |
| 4,480,200 | 10/1984 | Tan et al. | 307/354 |
| 4,626,716 | 12/1986 | Miki | 307/590 |
| 4,637,018 | 1/1987 | Flora et al. | 371/1 |
| 4,679,209 | 7/1987 | Hogeboom et al. | 375/17 |
| 5,245,223 | 9/1993 | Lim et al. | 307/362 |
| 5,546,025 | 8/1996 | Casselman | 327/43 |

FOREIGN PATENT DOCUMENTS

| 402184109 A | 7/1990 | Japan | 327/270 |
|---|---|---|---|
| 685570 | 3/1994 | Japan . | |

*Primary Examiner*—Timothy P. Callahan
*Assistant Examiner*—An T. Luu
*Attorney, Agent, or Firm*—Loeb & Loeb LLP

[57] ABSTRACT

The comparator circuit comprises a first comparator circuit having a differential input stage composed of P-channel FETs; a second comparator circuit having a differential input stage composed of N-channel FETs; pull-up and pull-down resistances connected to the output terminals of the two comparator circuits, respectively; at least one skew adjusting circuit having a delay circuit and a selector; and a logical gate for obtaining the two output signals of the two comparator circuits. Since the two differential input signals can be received by the two comparator circuits and according to the potentials of the two differential input signals, even if the supply potential is low, the comparator circuit can compare the two differential input signals in a wide potential range from the ground potential and the supply potential, so that it is possible to provide a high speed interface circuit which can satisfy the LVDS standard at a low supply potential.

18 Claims, 6 Drawing Sheets

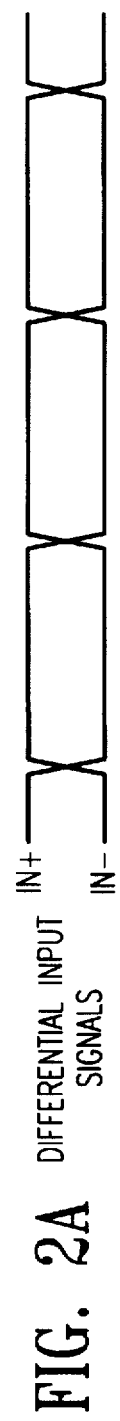
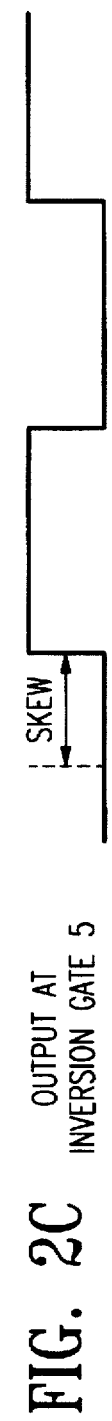
FIG. 2A  DIFFERENTIAL INPUT SIGNALS  IN+ / IN−
FIG. 2B  OUTPUT TERMINAL S5
FIG. 2C  OUTPUT AT INVERSION GATE 5
FIG. 2D  OUTPUT AT LOGICAL PRODUCT GATE 7

5,764,086

1

COMPARATOR CIRCUIT WITH WIDE DYNAMIC RANGE

BACKGROUND OF THE INVENTION

1. Field of the Invention

The present invention relates to a comparator circuit, and more specifically to a comparator circuit having a wide dynamic range which can satisfy a high speed interface standard for LVDS (low voltage differential signals).

2. Description of the Prior Art

High speed interfaces for LVDS (low voltage differential signals) are now being standardized by IEEE, as disclosed by IEEE Standard for Low-Voltage Differential Signals for SCI, LVDS, P1595, 3 Dec., 1993.

In this LVDS high speed interface standard, output signals of a driver circuit are two differential small-amplitude signals of about 1.0V for low voltage side and of 1.4V for high voltage side relative to a ground potential of the driver circuit.

This interface is utilized in the configuration disclosed in FIG. 5. At the transmitting terminal 100, a signal of CMOS level (3.3V) is converted by a driver circuit 101 into two LVDS level signals having current flow directions corresponding to the original signal level "0" or "1" and output them onto two parallel transfer lines 201 and 202. On the other hand, at the receiver terminal 300, a terminating resistor 1 converts input signals into CMOS level and a receiver circuit 301 detects "0" or "1" according to the directions of current flow and outputs the detected signal. As a receiver circuit for receiving the output signals, in general a differential comparator circuit whose input stage is composed of P channel FETs (field effect transistors) is used.

FIG. 6 is a circuit diagram showing a prior art construction of the differential comparator circuit. In FIG. 6, the differential comparator circuit is roughly composed of a differential pair of P channel FET P1 and P2; a current mirror circuits N1, N2 and N3, N4; and a push-pull output circuit P4, N5, P5 and N6.

In more detail, one of two differential input signals is given to a differential input terminal IN+, and the other of the two differential input signals is given to a differential input terminal IN–, respectively.

As described above, the driver circuit used in conformity with the LVDS high speed interface standard transmits signals by switching flow directions of the signal current. Signal currents flowing through the transmission paths are converted into differential input signals having CMOS level generated due to a voltage drop across the terminating resistance 1 in order to attain an impedance matching between the transmission path and the comparator circuit. The differential input signals are given to the two differential input terminals IN+ and IN– of the comparator circuit which is the major part of the receiver.

One of the two differential input signals given to the two differential input terminals IN+ and IN– as described above is given to a gate terminal of a P-channel FET P1 for constructing an input stage, and the other thereof is given to a gate terminal of a P-channel FET P2 for constructing the input stage of the differential pair. Here, when the two differential input signals are inputted, the mutual conductance (gm) of the FET P1 or P2 to which a higher potential differential input signal is applied becomes smaller than that of the FET P1 or P2 to which a lower potential differential input signal is applied, so that a constant current flows from a P-channel FET P3 (which serves as a constant current source) through the FET P1 or P2 of larger mutual conductance.

2

The current flowing through a differential pair FETs P1 and P2 reaches a connection node S1 or a connection node as S2. Here, two current mirror circuits are cross-connected to the differential pair FETs P1 and P2 as a load circuit. In more detail, the first current mirror circuit is composed of two N-channel FETs N1 and N2 whose gate terminals are connected in common. Further, the second current mirror circuit is composed of two N-channel FETs N3 and N4 whose gate terminals are also connected in common. Here, a drain terminal of the FET P1 and the common-connected gate terminals of the two FETs N1 and N2 are connected to the connection node S1, and a drain terminal of the FET P2 and the common-connected gate terminals of the two FETs N3 and N4 are connected to the connection node S2. Therefore, when the current of the differential pair FETs P1 and P2 flows to the connection node S1 or S2, the potential at the connection node S1 or S2 becomes a high level, and when the current of the differential pair FETs P1 and P2 does not flow to the connection node S1 or S2, the potential at the connection node S1 or S2 becomes a low level. The potential difference between the two connection nodes S1 and S2 is larger than that of the two inputted differential input signals.

The obtained potential difference between the two connection nodes S1 and S2 is amplified by a push-pull output circuit to an output signal having a signal amplitude between the high supply potential (or high supply voltage) and the low supply potential (or low supply voltage). Here, the push-pull output circuit is composed of a P-channel FET P4 and an N-channel FET N5 connected in series between the high supply potential and the low supply potential and a P-channel FET P5 and an N-channel FET N6 connected in series between the high supply potential and the low supply potential. The P-channel FET P4 has a gate terminal and a drain terminal connected in common; the N-channel FET N5 has a gate terminal connected to the connection node S1; the P-channel FET P5 has a gate terminal connected to the gate terminal of the P-channel FET P4; and the N-channel FET N6 has a gate terminal connected to the connection node S2. Further, a connection node between the P-channel FET P5 and the N-channel FET N6 is an output terminal of the differential comparator circuit.

In operation, when the potential of the differential input signal given to the differential input terminal IN+ is higher than the potential of the differential input signal given to the differential input terminal IN–, since the potential at the first connection node S1 is at a high level and the potential at the second connection node S2 is at a low level, the high level output signal can be obtained at the output terminal of the output circuit, as the output signal of the differential comparator circuit. On the other hand, when the potential of the differential input signal given to the differential input terminal IN+ is lower than the potential of the differential input signal given to the differential input terminal IN–, since the potential at the first connection node S1 is at the low level and the potential at the second connection node S2 is at the high level, the low level output signal can be obtained at the output terminal of the output circuit, as the output signal of the differential comparator circuit.

Further, in the differential comparator circuit shown in FIG. 6, two cross-coupled current mirror circuits are used as the load circuit, in order to provide hysteresis characteristics for the output signal relative to the differential input signals. The reason is as follows:

In general, since the load circuit is constructed by a current mirror circuit composed of FETs N1 and N2 of the same transistor size or by a current mirror circuit composed of FETs N3 and N4 of the same transistor size, when the potentials of two differential input signals are equal to each other, the output signal lies in an indefinite range. In other words, when the differential input voltage is [0], the output signal changes according to the direction that the differential input voltage changes. That is, the output signal changes always at the same differential input voltage (e.g., 0 volt).

However, when the power on the driver side drops and further the differential input voltage of the differential comparator circuit becomes [0], since the output signal becomes an indefinite state at a level near the logical threshold value, this causes an erroneous operation.

To overcome this problem, a load circuit provided with hysteresis characteristics is adopted as shown in FIG. 6. In more detail, in the load circuit shown in FIG. 6, the transistor size of the FET N1 is determined smaller than that of the FET N2, and further the transistor size of the FET N4 is determined smaller than that of the FET N3. In the construction as described above, when the potential difference between the two differential input signals is small, the operative current mirror circuit differs according to the change direction of the output signal. As described above, when the transistor size of the FETs for constructing the current mirror circuit is set to an unbalanced condition, even if the potential difference between the two differential input signals is [0], the output signal will not be changed, so that the preceding logical level can be maintained.

In the LVDS high speed interface standard in which the differential comparator circuit as described above is used, the signal level on the driver side is prescribed in a range from 1.0 V to 1.4V relative to the ground potential on the driver side. In addition, in the same standard, the allowable range of ±1V is provided between the ground potential on the driver side and the ground potential on the receiver side. As a result, the potential range of the differential input signals applied to the receiver circuit is 0V to 2.4V when seen from the ground potential on the receiver side. This potential range from 0V to 2.4V is wider than the potential range from 0V to 1.4V obtained when seen from the ground potential on the driver side. In other words, the potential range of the differential input signals applied to the receiver side (i.e., the comparator circuit side) is wide, as compared with that on the driver side.

When the above-mentioned differential comparator for receiving a wider differential input signals is operated at a relatively high supply potential of about 5V, it is possible to receive the differential input signals of wide potential range, without any restriction of the threshold potential of the P-channel FETs for constructing the differential input stage.

Recently, however, since there exists such a tendency that the supply potential of electronic devices or apparatus decreases more and more, when the supply potential is reduced down to such a low level as about 3V or lower, the operating range of the differential input stage is restricted by the threshold voltage of the P-channel FETs for constructing the differential input stage. For instance, when the supply potential is about 3V, the upper limit of the receivable differential input signals is restricted to about 2V, so that it is impossible to receive the differential input signals of the above-mentioned range from 0V to 2.4V.

The prior art circuit for processing the differential input signals is disclosed by Japanese Patent Laid-open Publication (Kokai) No. 6-85570, for instance. This document discloses an operational amplifier circuit operative at a low supply potential as follows: when the input signal voltage level lies in the operating range of a P-top type operational amplifier circuit whose first stage is comprised of a P channel FET, an P-top type operational amplifier operates; when the input signal voltage level lies in the operating range of the N-top type operational amplifier circuit whose first stage is comprised of an N channel FET, the N-top type operational amplifier operates, and when the input signal voltage level lies in both the operating ranges of the P-top type operational amplifier circuit and the N-top type operational amplifier circuit, a synthesized output of both the circuits can be obtained. This disclosed operational amplifier circuit amplifies and outputs an analog signal, which is essentially different from the circuit for outputting the comparison result of the differential input signals as digital signals, for instance as with the case of the differential comparator circuit.

In addition, the other documents relating to conventional differential comparator circuits are known as follows: U.S. Pat. No. 5,245,223 discloses a CMOS comparator provided with an input stage and a latch stage; ISSCC 94 /SESSION 14 /AMPLIFIERS /PAPER FA14.1 discloses a CMOS Rail-to-Rail type operational amplifier; Japanese Patent Laid-open Publication (Kokai) No. 5-95231 discloses an operational amplifier provided with a differential amplifier circuit and a current mirror circuit; Japanese Patent Laid-open Publication (Kokai) 4-306915 discloses a level converter circuit provided with a complementary type differential amplifier circuit and a damping amplifier circuit: U.S. Pat. No. 5,355,391 discloses a bus system composed of a differential cascode amplifier and a latch circuit of positive-feedback load; etc.

As described above, in the prior art differential comparator circuits conforming to the LVDS standard high speed interface for receiving the differential input signals by P-channel FETs, when the supply potential is as low as about 3V, since the upper limit potential of the receivable differential input signals is restricted by the threshold potential of the P-channel FETs, there exists a problem in that it is impossible to receive the differential input signals so as to satisfy the LVDS standard.

SUMMARY OF THE INVENTION

With these problems in mind, therefore, it is the object of the present invention to provide a comparator circuit, which can, even if the supply potential is low, receive the differential input signals of a wide potential range from the ground potential and the high supply potential; that is, which can receive differential input signals in conformity with the LVDS standard.

To achieve the above-mentioned object, according to first aspect of the invention, there is provided a comparator circuit, having a first comparator circuit including:

a pair of first conductivity type differential FETs for receiving two differential input signals at two gate terminals thereof, respectively; a first load circuit coupled to a pair of said first conductivity type differential FETs; and a first output circuit for push-pull amplifying a differential output of a pair of said first conductivity differential FETs (P1, P2) and for outputting the amplified differential output;

a second comparator circuit including: a pair of second conductivity type differential FETs for receiving two differential input signals at two gate terminals thereof, respectively; a second load circuit coupled to a pair of said second conductivity type differential FETs; and a second output circuit for push-pull amplifying a differential output of a pair of said second conductivity differential FETs and for outputting the amplified differential output;

a first level determinating element connected to one of the two output terminals of said first comparator circuit, for fixing potential at the output terminal at a high or low level when the output terminal of said comparator circuit is at a high impedance state;

a second level determinating element connected to another of the two output terminals of said second comparator circuit, for fixing potential at the output terminal at a high or low level when the output terminal of said comparator circuit is at a high impedance state;

a skew adjusting circuit for adjusting a skew between two output signals at two output terminals of said first and second comparator circuits, when said two compactor circuits are both operative; and a logical gate for obtaining a logical operation result of the two skew-adjusted output signals of said first and second comparator circuits and for outputting a comparison result signal according to comparison results of the two differential input signals applied to said first and second comparator circuits, respectively.

According to another aspect of the present invention, there is provided a receiver circuit including:

two input terminal connected to a parallel transmission line;

a terminating resistor connected across said parallel transmission line, for generating predetermined voltage range from current flowing through said parallel transmission line; and an above-mentioned comparator circuit, for receiving differential input signals generated across both end terminal of said terminating resistor.

According to third aspect of the present invention, there is provided an interface system including:

a driver circuit for converting a signal into differential signals which denote logical levels by direction of current;

a parallel transmission line for transmitting said differential signal; and an above-mentioned receiver circuit connected to said parallel transmission line.

BRIEF DESCRIPTION OF THE DRAWINGS

FIGS. 2A–2D a timing charts for assistance in explaining the phase relationship among two differential input signals, first and second comparator circuit outputs, and comparator circuit output shown in FIG. 1.

DETAILED DESCRIPTION OF THE PREFERRED EMBODIMENTS

The embodiments according to the present invention will be described hereinbelow with reference to the attached drawings.

Figure 1:
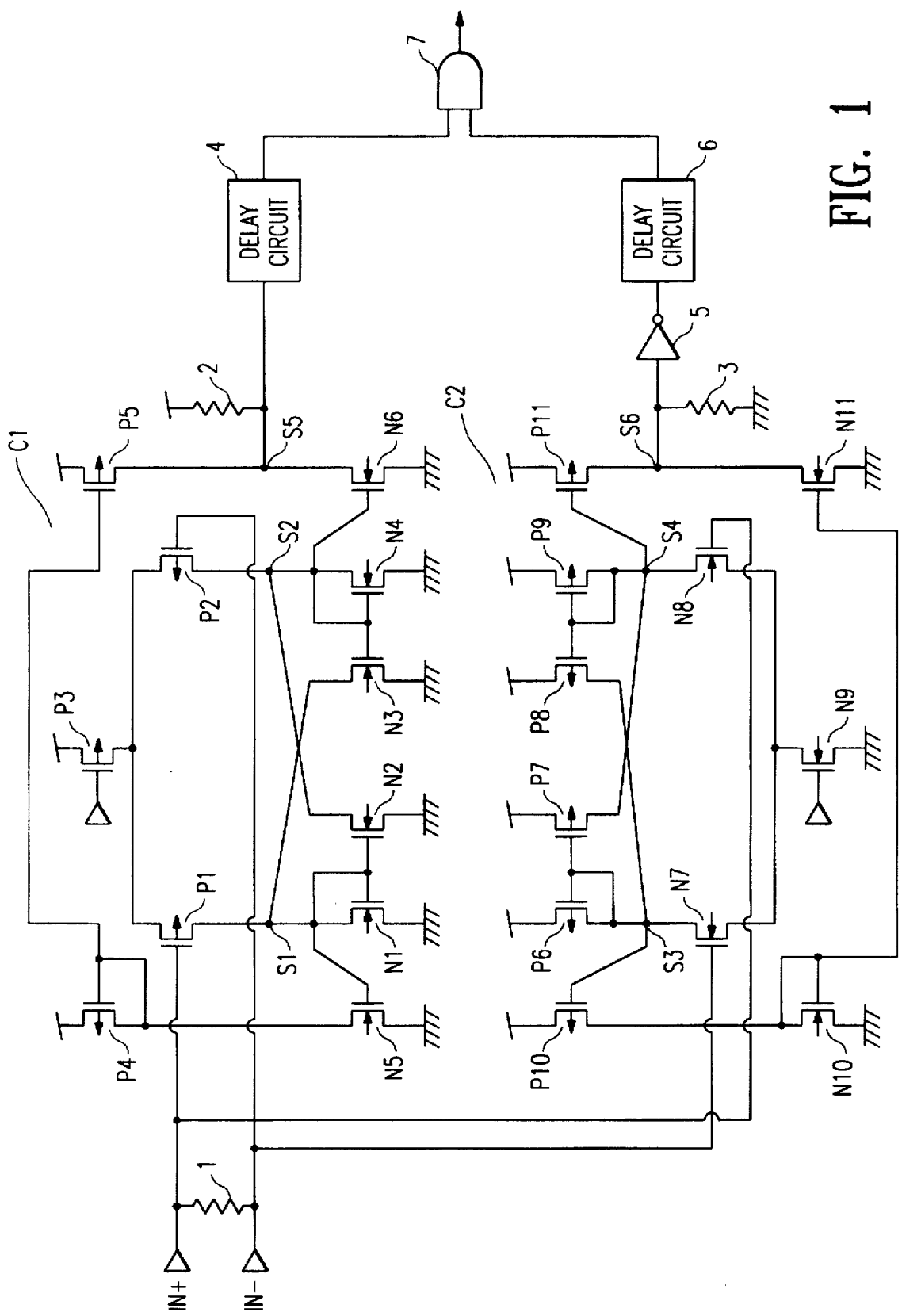
FIG. 1 is a circuit diagram showing an embodiment of the comparator a circuit according to the present invention.

FIG. 1 shows an embodiment of the present invention. The comparator circuit shown in FIG. 1 includes a first comparator circuit C1 whose differential input stage is constructed by P-channel FETs and a second comparator circuit C2 whose differential input stage is constructed by N-channel FETs. Further, the operation feature of the comparator circuit shown in FIG. 1 is as follows: when the differential input signals lie in a range between ground potential and ($V_{CC}$-|$V_{TP}$|) ($V_{CC}$: supply potential, $V_{TF}$: threshold potential of P-channel FETs), the differential input signals are received by the first comparator circuit C1; and when the differential input signals lie in a range between $V_{TN}$ and $V_{CC}$ ($V_{TN}$: threshold potential of N-channel FETs), the differential input signals are received by the second comparator circuit C2; and when the differential input signals can be received by both the first and second comparator circuits C1 and C2, the same output can be obtained by both the comparator circuits C1 and C2.

Figure 5:
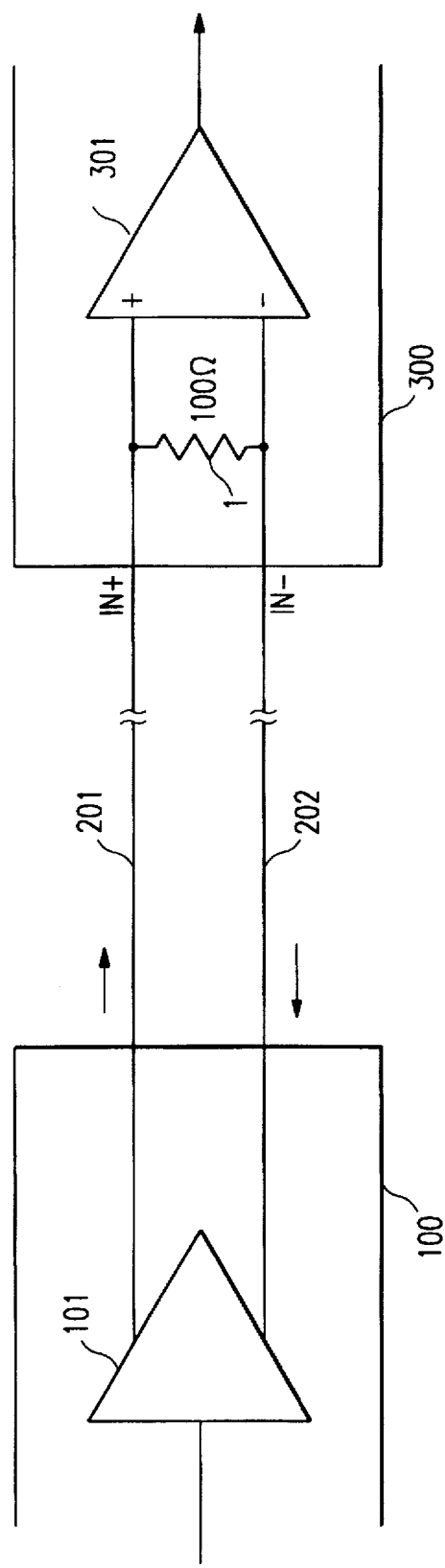
FIG. 5 is a diagram showing outline construction of LVDS interface system.
Figure 6:
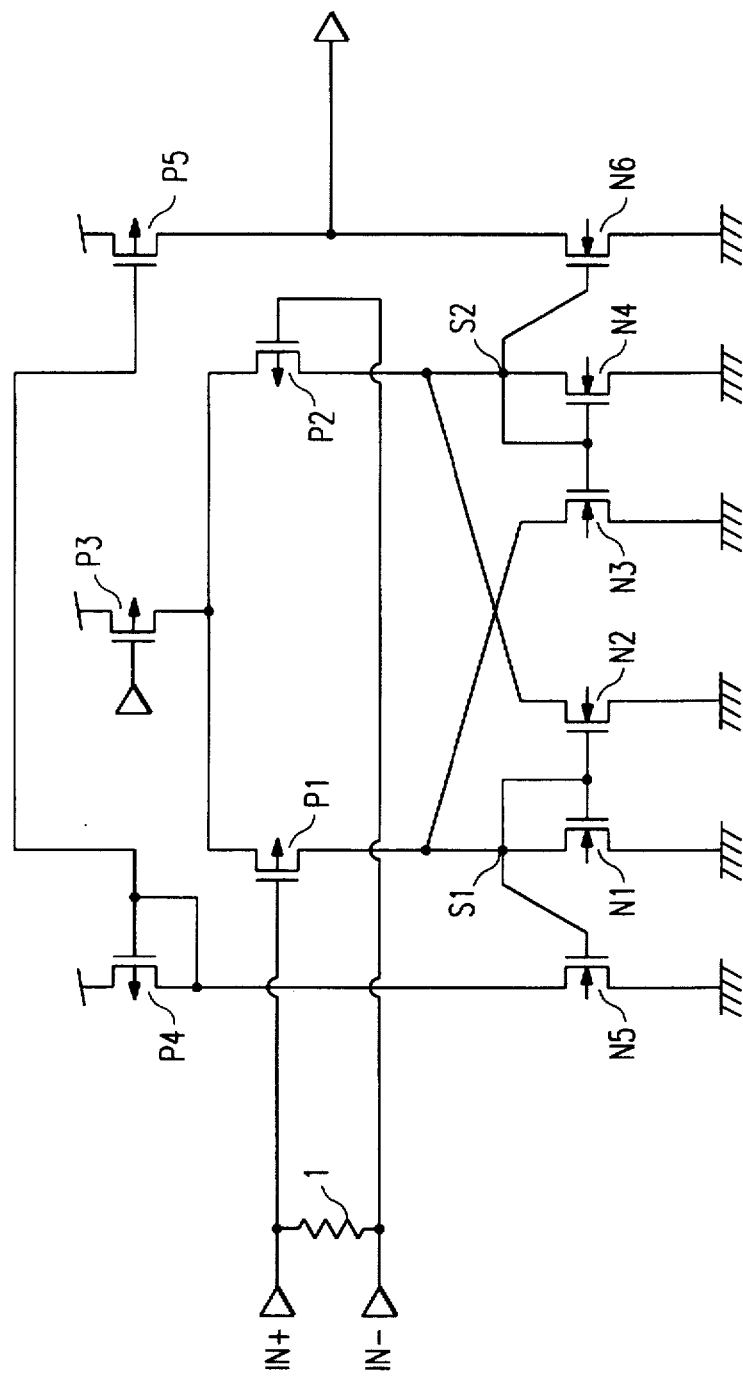
FIG. 6 is a circuit diagram showing a prior art comparator circuit.

Further, the first comparator circuit C1 shown in FIG. 1 is basically the same as the prior art comparator circuit shown in FIG. 6, so that the same reference numerals have been retained for similar parts or elements having the same functions as with the case of the prior art comparator circuit shown in FIG. 5, without repeating the similar description thereof.

In FIG. 1, the second comparator circuit C2 is composed of a differential input stage including an N-channel FET N7, an N-channel FET N8; a load circuit (for the differential input stage) made up of a current mirror circuit having a P-channel FET P6 and a P-channel FET P7 and another current mirror circuit having a P-channel FET P8 and a P-channel FET P9; and an output circuit made up of an N-channel FET N10 and a P-channel PET P10 connected in series between the supply potential and the ground potential and an N-channel FET N11 and a P-channel FET P11 connected in series between the supply potential and the ground potential. Further, the output terminal of the second comparator circuit C2 is a connection node S6 between the two FETs N11 and P11 of the output circuit.

In more detail, the N-channel FET N7 has a gate terminal for receiving one differential input signal applied to the differential input terminal IN-, and a source terminal connected to the ground potential via an N-channel FET N9 which serves as a constant current source. The N-channel FET N8 has a gate terminal for receiving the other differential input signal applied to the differential input terminal IN+, and a source terminal connected to the ground potential via the N-channel FET N9 which serves as a constant current source.

The P-channel FET P6 has a source terminal connected to the high supply potential and a gate terminal connected in common to a drain terminal thereof connected to a third connection node S3. The P-channel FET P7 has a source terminal connected to the high supply potential, a gate terminal connected in common to the gate terminal of the P-channel FET P6, and a drain terminal connected to a fourth connection node S4. The P-channel FET P9 has a source terminal connected to the high supply potential and a gate terminal connected in common to a drain terminal thereof connected to the fourth connection node S4. The P-channel FET P8 has a source terminal connected to the high supply potential, a gate terminal connected in common to the gate terminal of the P-channel FET P9, and a drain terminal connected to the third connection node S3.

The N-channel FET N10 has a gate terminal connected to a drain terminal thereof, and a source terminal connected to the ground potential. The P-channel FET P10 has a gate terminal connected to the third connection node S3, and a source terminal connected to the supply potential. Both the N-channel FET N10 and the P-channel FET P10 are connected in series between the supply potential and the ground potential.

The N-channel FET N11 has a gate terminal connected to the gate terminal of the N-channel FET N10, and a source terminal connected to the ground potential. The P-channel FET P11 has a gate terminal connected to the fourth connection node S4, and a source terminal connected to the supply potential. Both the N-channel FET N11 and the P-channel FET P11 are connected in series between the supply potential and the ground potential.

A pull-up resistance 2 is connected to a connection node S5 (i.e. an output terminal of the first comparator circuit C1), in order to fix the potential at the output terminal S5 to the high level when the differential input signals cannot be received by the first comparator circuit C1 and thereby the output is in an indefinite status. In the same way, a pull-down resistance 3 is connected to the connection node S6 of the second comparator circuit C2, in order to fix the connection node S6 at the low level when the differential input signals cannot be received by the second comparator circuit C2 and thereby the output is in an indefinite status.

The output of the first comparator circuit C1 is given to a delay circuit 4, and the output of the second comparator circuit C2 is given to a delay circuit 6 via an inversion gate 5. After being delayed by the corresponding delay circuits 4 and 6, respectively, the two outputs of the two comparator circuits C1 and C2 are given to a logical product gate 7. Therefore, a logical product of both the outputs can be obtained as the output of the comparator circuit according to the present invention When the potentials of the differential input signals lie within the range receivable by both the first and second comparator circuits C1 and C2, both the two comparator circuits C1 and C2 operate to output the two output signals from the corresponding output terminals S5 and S6, respectively. In this case, there exists the case where a skew of about a half cycle is generated between the clock signal shown in FIG. 2A and the output signal shown in FIG. 2B at the output terminal S5 and the output signal shown in FIG. 2C of the inversion gate 5, due to the difference in construction between the two comparator circuits C1 and C2. The skew as described above tends to be generated when the frequency of the differential input signals becomes as high as 200 MHz to 1 GHz. Further, the skew changes according to the levels of the differential input signals. Therefore, when the output signals including a skew as described above are applied directly to the logical product gate 7, since an erroneous logical product (different from an original product obtained when two output signals are in phase with each other at the output terminal S5 and the inversion gate 5) is outputted from the logical product gate 7, an erroneous operation may occur.

To overcome this problem, delay circuits 4 and 6 are provided. The delay circuit 4 appropriately delays the output signal of the first comparator circuit C1, and the delay circuit 6 appropriately delays the output signal of the second comparator circuit C2 after having been inverted through the inversion gate 5. In other words, both the delay circuits 4 and 6 previously adjust a skew between the output signal of the first comparator circuit C1 and the inversion output signal of the second comparator circuit C2.

Figure 3:
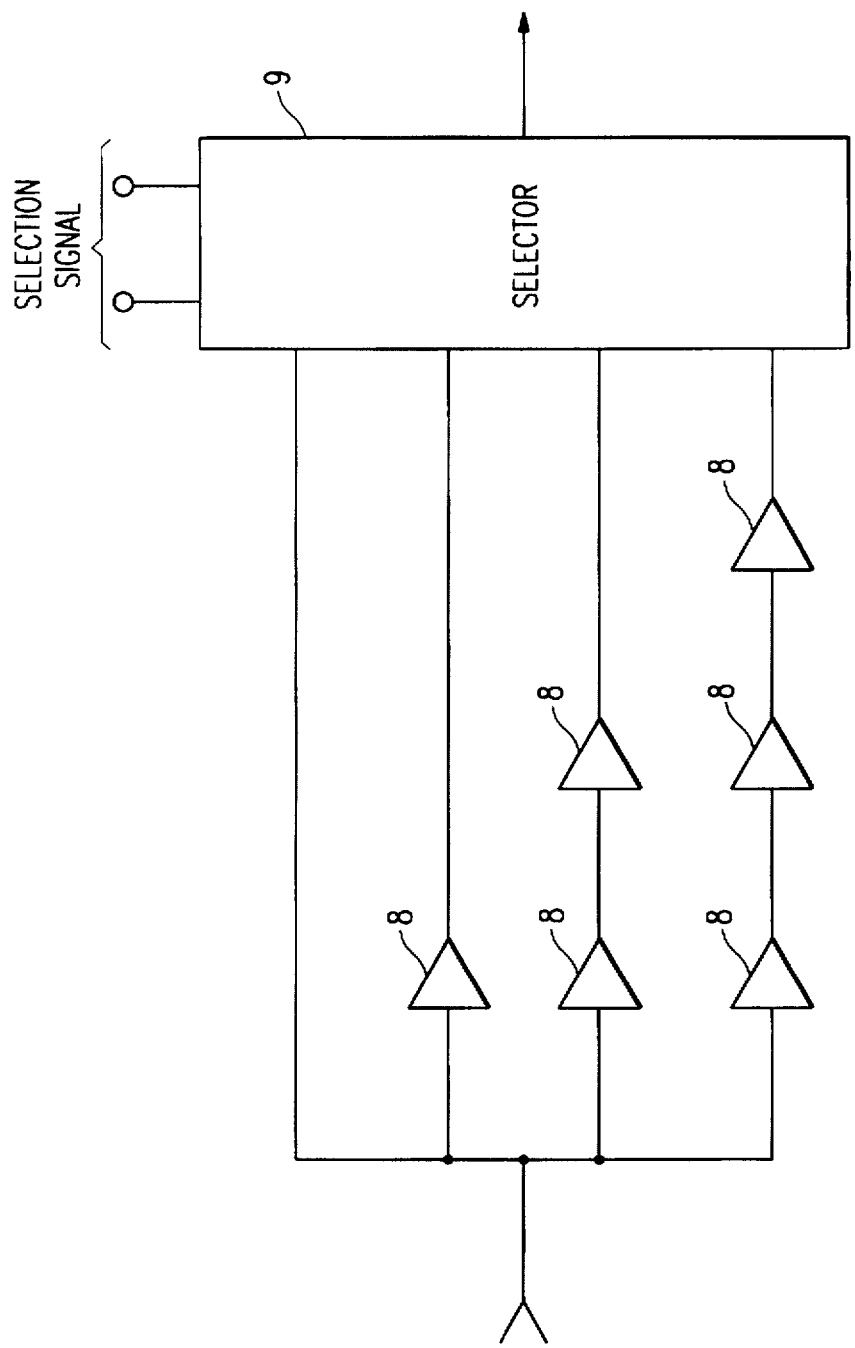
FIG. 3 is a practical circuit diagram showing the delay circuit shown in FIG. 1.

FIG. 3 shows a practical construction of the delay circuits 4 and 6 each for previously adjusting a skew between the output signal of the first comparator circuit C1 and the inversion output of the second comparator circuit C2.

In FIG. 3, each delay circuit 4 or 6 is composed of a selector and a plurality of delay paths each having buffer circuits 8 connected in series at one to three stages. Each buffer 8 receives digital signals given by the output terminal S5 or the inversion gate 5, and delays the received digital signals as a delay circuit. The selector 9 alternatively selects digital signals applied directly from the output terminal S5 or the inversion gate 5 or indirectly through a single buffer circuit 8 or plural buffer circuits 8. Here, the digital signals are at the high level (the supply potential) or at the low level (the is ground potential) both determined by the output terminal S5 or the inversion gate 5. Therefore, the high- or low-level digital signals are given to the selector 9 directly without being delayed or indirectly being delayed by the one-, two- or three-stage buffer circuits 8, and then outputted from the selector 9 alternatively on the basis of the two-bit select signals externally applied to the selector 9. Further, it is also preferable to generate the two-bit select signals applied to the selector 9 on the basis of the output of the logical product gate 7. Still further, each buffer circuit 8 practically has a delay time of e.g. 200 pS (pico second) for 200 MHz.

In the comparator circuit constructed as described above, the operation obtained when one of the differential input signals is deviated from the receivable range of the comparator circuit will be described hereinbelow.

The case where the first comparator circuit C1 cannot receive two differential input signals will be considered herein. For instance, if the differential input signal receivable range of the first comparator circuit C1 is set to a range from 0V to 2V and the differential input signal receivable range of the second comparator circuit C2 is set to a range from 1V to 2.4V (where the supply potential is about 3.3V), when the input signal is 2V or higher, the second comparator circuit C2 can receive the differential input signals. Therefore, in this case, the two differential input signals are compared by only the second comparator circuit C2, and the comparison result of the digital output signals according to the difference between the two differential input signals is outputted from the connection node (the output terminal) S6.

Further, the supply potential and the potential ranges of the first and second comparator circuits C1 and C2 (in which the two differential input signals can be received) are not limited only to the above-mentioned values. Further, even if the supply potential higher or lower than 3V is used, the two differential input signals can be received without being subjected to the influence of the threshold voltage of the used FETs.

On the other hand, in the first comparator circuit C1, since the two FETS P1 and P2 of the differential input stage are both cut off, the potential at the two connection nodes S1 and S2 are in the vicinity of |V$_{TP}$|, so that the FETs P5 and N6 are both turned off. Therefore, the output terminal S5 of the first comparator C1 is in a floating or high impedance status. In this case, however, since the pull-up resistance 2 is coupled to the connection node S5, the potential at the output terminal S5 is kept at the high level.

Therefore, the inversion output signal of the second comparator circuit C2 is outputted through the logical product gate 7 without being delayed by the delay circuit 6. In other words, when the differential input signals are 2V or higher and further when the potential of one of the two differential input signals applied to the differential input terminal IN+ is higher than that of the other of the two differential input signals applied to the differential input terminal IN−, the connection node S6 of the second comparator circuit C2 is at the high level, so that the low-level comparison result is outputted from the logical product gate 7. On the other hand, when the potential of one of the two differential input signals applied to the differential input terminal IN+ is lower than that of the other of the two differential input signals applied to the differential input terminal IN−, the connection node S6 of the second comparator circuit C2 is at the low level, so that the high-level comparison result is outputted from the logical product gate 7.

Further, when the two differential input signals no more than 1V are applied to both the differential input terminals IN+ and IN−, since the first comparator circuit C1 is in a signal receivable status, the two differential input signals are compared by the first comparator circuit C1, and the comparison result of the digital output signals according to the difference between the two differential input signals is outputted from the output terminal S5.

On the other hand, in the second comparator circuit C2, since the two FETS N7 and N8 of the differential input stage are both cut off, the potential at the two connection nodes S3 and S4 are at the potential for cutting off the FETs P6, P7, P8 and P9, and further the FETs P11 and N11 are both cut off. Therefore, the connection node S6 of the second comparator C2 is in a floating or high impedance status. In this case, however, since the pull-down resistance 3 is coupled to the connection node S6, the potential at the output terminal S6 is kept at the low level.

Therefore, the output signal of the first comparator circuit C1 is outputted through the logical product gate 7 without being delayed by the delay circuit 4. In other words, when the two differential input signals are 1V or lower and further when the potential of one of the two differential input signals applied to the differential input terminal IN+ is higher than that of the other of the two differential input signals applied to the differential input terminal IN−, the output terminal S5 of the first comparator circuit C1 is at the low level, so that the low-level comparison result is outputted from the logical product gate 7. On the other hand, when the potential of one of the two differential input signals applied to the differential input terminal IN+ is lower than that of the other of the two differential input signals applied to the differential input terminal IN−, the output terminal S5 of the first comparator circuit C1 is at the high level, so that the high-level comparison result is outputted from the logical product gate 7.

As a result, when the two differential input signals are 2V or higher or 1V or lower, the two differential input signals are compared with any one of the first and second comparator circuits C1 and C2. In this case, the same comparison result can be obtained, irrespective of the comparator circuits C1 and C2.

Further, when the two differential input signals are in a range from 1V to 2V and further when the first and second comparator circuits C1 and C2 can receive both the two differential input signals, as already described above, since the two comparator circuits C1 and C2 operate to compare the two differential input signals respectively, the respective comparison results can be obtained at the two output terminals S5 and S6 of the two comparator circuits C1 and C2.

In this case, in comparison with the case where any one of the two comparator circuits is receivable, although being different in potential, the comparison results of the two comparator circuits C1 and C2 are the same as when the two differential input signals are compared with any one of the comparator circuits C1 and C2. That is, the comparison result (i.e., the high or low level) obtained at the output terminal S5 of the first comparator circuit C1 is the same as the inversion output (i.e., the high or low level) obtained by inverting the comparison result obtained at the connection node S6 of the second comparator circuit C2 by the inversion gate 7.

The comparison results are delayed a predetermined delay time by the corresponding delay circuits 4 and 6, respectively. Therefore, after a skew between the output signal of the first comparator circuit C1 at the output terminal S5 and the output signal of the inversion gate 5 has been removed, the two output signals of the two comparator circuits C1 and C2 are given to the logical product gate 7, so that it is possible to obtain the comparison result of the two differential input signals as the output signal of the logical product gate 7.

As described above, when the supply potential is low, the first comparator circuit C1 whose differential input stage is composed of P-channel FETs can receive the two differential input signals in a low voltage range. Further, when the supply potential is high, the second comparator circuit C2 whose differential input stage is composed of N-channel FETs can receive the two differential input signals in a high voltage range. Further, when both the comparator circuits C1 and C2 can receive the two differential input signals, the comparator circuit is so constructed that the comparison results of both the comparator circuits C1 and C2 are equal to each other. As a result, it is possible to realize a comparator circuit of wide dynamic range which can receive the two differential input signals of a wide potential level between the supply potential and the ground potential.

Therefore, it is possible to provide a high speed interface circuit which can satisfy the LVDS standard at a low supply potential less than 3V, for instance.

Further, in the comparator circuit according to the present invention, when both the first and second comparator circuits C1 and C2 can receive the two differential input signals, a skew between the digital signal indicative of the comparison result of the first comparator circuit C1 and the digital signal indicative of the inverted comparison result of the second comparator circuit C2 can be removed before obtaining the logical product of both the comparison results, it Is possible to prevent an erroneous comparison result caused by skew between both the digital output signals of both the comparator circuits C1 and C2 from being outputted from the logical product gate 7.

Figure 4:
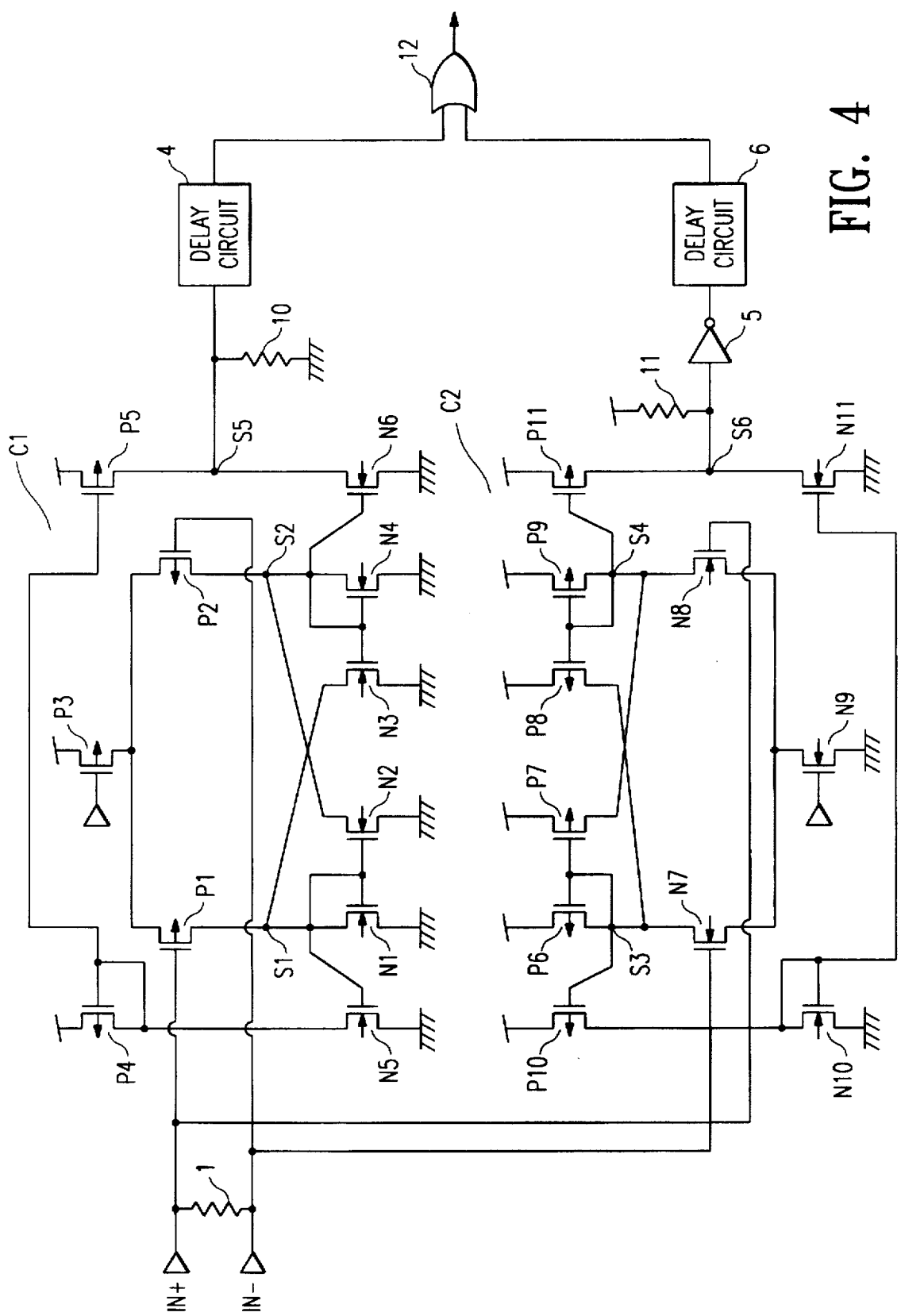
FIG. 4 is a circuit diagram showing a modification of the comparator circuit shown in FIG. 1.

FIG. 4 shows a modification of the comparator circuit shown in FIG. 1, in which the same reference numerals have been retained for similar elements or parts having the same functions as with the case of the comparator circuit shown in FIG. 1. The modification shown in FIG. 4 is different from the comparator circuit shown in FIG. 1 in that a pull-down resistance 10 is connected to the output terminal (or the connection node) S5 of the first comparator circuit C1, instead of the pull-up resistance 2 shown in FIG. 1; a pull-up resistance 11 is connected to the output terminal (or the connection node) S6 of the second comparator circuit C2, instead of the pull-down resistance 3 shown in FIG. 1; and a logical sum gate 12 is connected to the two delay circuits 4 and 6, instead of the logical product gate 7. The circuit construction other than the above is the same as with the case of the circuit construction shown in FIG. 1. In the modification as shown in FIG. 4, it is possible to obtain the similar operation and effect, as with the case of the comparator circuit shown in FIG. 1.

Further, when the first comparator circuit C1 or the second comparator circuit C2 cannot receive the differential input signals, there are four combinations of fixing the output terminals S5 and S6 at a high or low level as follow: the two output terminals S5 and S6 are set both to the high level; set to the high level and the low level; set to the low level and the high level; and set both to the low level. However, any combinations can be adopted, as far as the outputs are not contradictory to each other when seen from the entire comparator circuit.

In the above embodiments, pull-up resistances and pull-down resistances are used. However, for these elements, it is not necessary to limit to the resistances, but any other elements which can lead the signal levels upward or downward, for example, active elements such as transistors, can be employed.

As described above, in the comparator circuit according to the present invention, since the two differential input signals can be received by the first comparator circuit C1 composed of FETs P1 and P2 and/or the second comparator circuit C2 composed of FETs N7 and N8 according to the potentials of the two differential input signals, even if the supply potential is low, the comparator circuit can compare the two differential input signals in a wide potential range from the ground potential and the supply potential, so that it is possible to provide a high speed interface circuit which can satisfy the LVDS standard at a low supply potential.

What is claimed is:

1. A comparator circuit, comprising:
   a first comparator circuit including:
      a pair of first conductivity type differential FETs for receiving two differential input signals at two gate terminals thereof, respectively;
      a first load circuit coupled to a pair of said first conductivity type differential FETs; and
      a first output circuit for push-pull amplifying a differential output of a pair of said first conductivity type differential FETs and for outputting the amplified differential output;
   a second comparator circuit including:
      a pair of second conductivity type differential FETs for receiving two differential input signals at two gate terminals thereof, respectively;
      a second load circuit coupled to a pair of second conductivity type differential FETs; and
      a second output circuit for push-pull amplifying a differential output of a pair of said second conductivity type differential FETs and for outputting the amplified differential output;
   a first level determining element connected to a first output terminal of said first comparator circuit, for fixing a potential at the first output terminal at a high or low level when the first output terminal of said first comparator circuit is at a high impedance state;
   a second level determining element connected to a second output terminal of said second comparator circuit, for fixing a potential at the second output terminal at a high or low level when the second output terminal of said second comparator circuit is at a high impedance state;
   a skew adjusting circuit for adjusting a skew between two output signals at said first and second output terminals of said first and second comparator circuits, when said first and second comparator circuits are both operative; and
   a logical gate for obtaining a logical operation result of the two skew-adjusted output signals of said first and second comparator circuits and for outputting a comparison result signal according to comparison results of the two differential input signals applied to said first and second comparator circuits, respectively.

2. The comparator circuit according to claim 1, wherein said first load circuit comprises a first and a second current mirror circuit each composed of two second conductivity type FETs, said first and second current mirror circuits being cross-coupled to said pair of first conductivity type differential FETs, and wherein said second load circuit comprises a third and a fourth current mirror circuit each composed of two first conductivity type FETs, said third and fouth current mirror circuits being cross-coupled to said pair of second conductivity type differential FETs.

3. The comparator circuit according to claim 1, wherein said first level determining element is one of pull-up resistance or pull-down resistance and said second level determining element is the other of pull-up resistance or pull-down resistance.

4. The comparator circuit according to claim 1, wherein said adjusting circuit comprises a delay circuit providing a plurality of different, selectable delay times in response to a selection input.

5. The comparator circuit according to claim 4, wherein said delay circuit includes a plurality of delay paths, each having a different number of buffer circuits connected in series, wherein each of the buffer circuits has a predetermined delay time.

6. The comparator circuit according to claim 3, wherein said logical gate executes a logical product operation when a pull-up resistance is connected to the output terminal of said first comparator circuit and a pull-down resistance is connected to the output terminal of said second comparator circuit.

7. The comparator circuit according to claim 3, wherein said logical gate executes a logical sum operation when a pull-down resistance is connected to the output terminal of said first comparator circuit and a pull-up resistance is connected to the output terminal of said second comparator circuit.

8. The comparator circuit according to claim 1, wherein said first comparator circuit produces an indefinite output when a magnitude of said two differential input signals is of such a level that said pair of first conductivity type differential FETs are in a cut off state.

9. The comparator circuit according to claim 8, wherein said second comparator circuit produces an indefinite output when said level of said two differential input signals is such that said pair of second conductivity type differential FETs are in a cut off state.

10. The comparator circuit according to claim 1, wherein said first output terminal is in a floating state when a level of said two differential input signals is such that said pair of first conductivity type differential FETs are in a cut off state.

11. The comparator circuit according to claim 10, wherein said second output terminal is in a floating state when said level of said two differential input signals is such that said pair of second conductivity type differential FETs are in a cut off state.

12. The comparator circuit according to claim 1, wherein said second comparator circuit produces an indefinite output when a level of said two differential input signals is such that said pair of second conductivity type differential FETs are in a cut off state.

13. The comparator circuit according to claim 1, wherein said second output terminal is in a floating state when a level of said two differential input signals is such that said pair of second conductivity type differential FETs are in a cut off state.

14. A comparator circuit, comprising:
a first comparator circuit including:
first differential pair FETs having:
a first P-channel FET having a gate terminal for receiving one of two differential input signals, a source terminal connected to a high supply potential via a P-channel FET serving as a constant current source, and a drain terminal connected to a first connection node; and
a second P-channel FET having a gate terminal for receiving the other of the two differential input signals, a source terminal connected to the source terminal of said first P-channel FET and to the high supply potential via the P-channel FET serving as a constant current source, and a drain terminal connected to a second connection node;
a first load circuit including:
a first current mirror circuit composed of two N-channel FETs, gate terminals thereof being connected in common and source terminals thereof being connected in common to a low supply potential, a drain terminal of one of the two N-channel FETs being connected to the gate terminal thereof and to the first connection node, and a drain terminal of the other of the two N-channel FETs being connected to the second connection node; and
a second current mirror circuit composed of other two N-channel FETs, gate terminals thereof being connected in common and source terminals thereof being connected in common to the low supply potential, a drain terminal of one of the two N-channel FETs being connected to the gate terminal thereof and to the second connection node, and a drain terminal of the other of the two N-channel FETS being connected to the first connection node; and
a first output circuit including;
a third P-channel FET having a gate terminal and a drain terminal connected in common;
an N-channel FET having a gate terminal connected to the first connection node, said third P-channel FET and said N-channel FET being connected in series between the high supply potential and the low supply potential;
a fourth P-channel FET having a gate terminal connected to the gate terminal of said third P-channel FET;. and
an N-channel FET having a gate terminal connected to the second connection node, said fourth P-channel FET and said N-channel FET being connected in series between the high supply potential and the low supply potential, a connection node between said fourth P-channel FET and said N-channel FET being determined as an output terminal of said first comparator circuit; and
a second comparator circuit including:
second differential pair FETs having:
a first N-channel FET having a gate terminal for receiving the other of two differential input signals, a source terminal connected to the low supply potential via an N-channel FET serving as a constant current source, and a drain terminal connected to a third connection node; and
a second N-channel FET having a gate terminal for receiving one of the two differential input signals, a source terminal connected to the source terminal of said first N-channel FET and to the high supply potential via the N-channel FET serving as a constant current source, and a drain terminal connected to a fourth connection node;
a second load circuit including:
a third current mirror circuit composed of two P-channel FETs, gate terminals thereof being connected in common and source terminals thereof being connected in common to the high supply potential, a drain terminal of one of the two P-channel FETs being connected to the gate terminal thereof and to the third connection node, and a drain terminal of the other of the two P-channel FETs being connected to the fourth connection node; and
a fourth current mirror circuit composed of other two P-channel FETs, gate terminals thereof being connected in common and source terminals thereof being connected in common to the high supply potential, a drain terminal of one of the two P-channel FETs being connected to the gate terminal thereof and to the fourth connection node, and a drain terminal of the other of the two P-channel FETs being connected to the third connection node; and
a second output circuit including:
a third N-channel FET having a gate terminal and a drain terminal connected in common;
a P-channel FET having a gate terminal connected to the third connection node, said third N-channel FET and said P-channel FET being connected in series between the high supply potential and the low supply potential;
a fourth N-channel FET having a gate terminal connected to the gate terminal of said third N-channel FET; and
a P-channel FET having a gate terminal connected to the fourth connection node, said fourth N-channel FET and said P-channel FET being connected in en the high supply potential and the low supply potential, a connection node between said fourth N-channel FET and said P-channel FET being determined as an output terminal of said second comparator circuit; and
an adjusting circuit including:
a delay section for inputting an output signal of said first output circuit or an inversion output signal of said second output circuit, delaying the output signal through a plurality of series- and parallel-connected buffer circuits, and outputting a plurality of output signals of different delay times, respectively;
a selector for alternatively selecting either one of the output signals or the output signals delayed by said delaying section on the basis of a select signal applied from the outside; and
a logical product gate for obtaining a logical product of the two output signals of said first and second comparator circuits or a logical sum gate for obtaining a logical sum of the two output signals of said first and second comparator circuits.
15. A receiver circuit comprising:
two input terminals connected to a parallel transmission line;
a terminating resistor connected across said parallel transmission line, for generating predetermined voltage range from current flowing through said parallel transmission line; and a comparator circuit for receiving differential input signals generated across both end terminals of said terminating resistor said comparator circuit comprising:
a first comparator circuit including:
a pair of first conductivity type differential FETs for receiving two differential input signals at two gate terminals thereof, respectively;
a first load circuit coupled to a pair of said first conductivity type differential FETs; and
a first output circuit for push-pull amplifying a differential output of a pair of said first conductivity type differential FETs and for outputting the amplified differential output;
a second comparator circuit including:
a pair of second conductivity type differential FETs for receiving two differential input signals at two gate terminals thereof, respectively;
a second load circuit coupled to a pair of second conductivity type differential FETs; and
a second output circuit for push-pull amplifying a differential output of a pair of said second conductivity type differential FETs and for outputting the amplified differential output;
a first level determining element connected to a first output terminal of said first comparator circuit, for fixing a potential of the first output terminal at a high or low level when said two differential input signals produce a floating state at said first output terminal of said first comparator circuit;
a second level determining element connected to a second output terminal of said second comparator circuit, for fixing a potential of the second output terminal at a high or low level when said two differential input signals produce a floating state at said second output terminal of said second comparator circuit;
a skew adjusting circuit for adjusting a skew between two output signals at said first and second output terminals of said first and second comparator circuits, when said first and second comparator circuits are both operative; and
a logical gate for obtaining a logical operation result of the two skew-adjusted output signals of said first and second comparator circuits and for outputting a comparison result signal according to comparison results of the two differential input signals applied to said first and second comparator circuits, respectively.

16. The receiver circuit according to claim 15, wherein said potential at said first output terminal is set by said first level determining element when said first output terminal is in a high impedance state, and wherein said potential at said second output terminal is set by said second level determining element when said second output terminal is in a high impedance state.

17. An interface system comprising:
a driver circuit for converting a signal into differential signals which denote logical levels by direction of current;
a parallel transmission line for transmitting said differential signal; and a receiver circuit connected to said parallel transmission line, said receiver circuit comprising:
two input terminals connected to said parallel transmission line;
a terminating resistor connected across said parallel transmission line, for generating predetermined voltage range from current flowing through said parallel transmission line; and
a comparator circuit for receiving differential input signals generated across both end terminals of said terminating resistor, said comparator circuit comprising:
a first comparator circuit including:
a pair of first conductivity type differential FETs for receiving two differential input signals at two gate terminals thereof, respectively;
a first load circuit coupled to a pair of said first conductivity type differential FETs; and
a first output circuit for push-pull amplifying a differential output of a pair of said first conductivity type differential FETs and for outputting the amplified differential output;
a second comparator circuit including:
a pair of second conductivity type differential FETs for receiving two differential input signals at two gate terminals thereof, respectively,
a second load circuit coupled to a pair of second conductivity type differential FETs; and
a second output circuit for push-pull amplifying a differential output of a pair of said second conductivity type differential FETs and for outputting the amplified differential output;
a first level determining element connected to a first output terminal of said first comparator circuit, for fixing a potential of the first output terminal at a high or low level when said first output terminal is at a floating state,
a second level determining element connected to a second output terminal of said second comparator circuit, for fixing a potential of the second output terminal at a high or low level when said second output terminal is at a floating state,
a skew adjusting circuit for adjusting a skew between two output signals at said first and second output terminals of said first and second comparator circuits, when said first and second comparator circuits are both operative, and
a logical gate for obtaining a logical operation result of the two skew-adjusted output signals of said first and second comparator circuits and for outputting a comparison result signal according to comparison results of the two differential input signals applied to said first and second comparator circuits, respectively.

18. The interface system according to claim 17 wherein said potential at said first output terminal is set by said first level determining element when said first output terminal is in a high impedance state, and wherein said potential at said second output terminal is set by said second level determining element when said second output terminal is in a high impedance state.

* * * * *